United States Patent
Lee et al.

(10) Patent No.: US 10,700,303 B1
(45) Date of Patent: Jun. 30, 2020

(54) ORGANIC LIGHT-EMITTING DIODE

(71) Applicants: Yuan Ze University, Chung-Li (TW); Nichem Fine Technology Co, Ltd., Jhubei, Hsinchu County (TW); WISECHIP SEMICONDUCTOR INC., Zhunan Township, Miaoli County (TW); Tetrahedron Technology Corporation, Zhunan Township, Miaoli County (TW); SHINE MATERIALS TECHNOLOGY CO., LTD., Kaohsiung (TW)

(72) Inventors: Jiun-Haw Lee, Chung-Li (TW); Tien-Lung Chiu, Chung-Li (TW); Chia-Hsun Chen, Chung-Li (TW); Pei-Hsi Lee, Chung-Li (TW)

(73) Assignees: YUAN ZE UNIVERSITY, Chung-Li (TW); NICHEM FINE TECHNOLOGY CO, LTD., Jhubei, Hsinchu County (TW); WISECHIP SEMICONDUCTOR INC., Zhunan Township, Miaoli County (TW); TETRAHEDRON TECHNOLOGY CORPORATION, Zhunan Township, Miaoli County (TW); SHINE MATERIALS TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/353,578

(22) Filed: Mar. 14, 2019

(30) Foreign Application Priority Data

Jan. 11, 2019 (TW) .............................. 108101237 A (51) Int. Cl.
*H01L 51/52* (2006.01)
*G09G 3/20* (2006.01)
*H01L 51/50* (2006.01)

(52) U.S. Cl.
CPC ....... *H01L 51/5221* (2013.01); *G09G 3/2003* (2013.01); *H01L 51/5056* (2013.01); *H01L 51/5072* (2013.01); *H01L 51/5206* (2013.01)

(58) Field of Classification Search
CPC ............. H01L 51/5221; H01L 51/5056; H01L 51/5072; H01L 51/5206; G09G 3/2003
See application file for complete search history.

(56) References Cited

U.S. PATENT DOCUMENTS

8,742,657 B2 * 6/2014 Xia ..................... H01L 27/3211
313/501
9,653,691 B2 * 5/2017 So ........................ H01L 51/0085
(Continued)

*Primary Examiner* — Dmitriy Bolotin
(74) *Attorney, Agent, or Firm* — Birch, Stewart, Kolasch & Birch LLP (57) ABSTRACT

An organic light-emitting diode including an anode, a cathode, and a luminescent layered structure is provided. The luminescent layered structure is disposed between the anode and the cathode. The luminescent layered structure has a luminescent layer and a sensitizer layer. The luminescent layer has a luminescent-layer ground state, a luminescent-layer singlet state and a luminescent-layer triplet state, in which two times of the luminescent-layer triplet state is higher than the luminescent-layer singlet state. The sensitizer layer has a sensitizer-layer triplet state, which is between the luminescent-layer singlet state and the luminescent-layer triplet state. The molecules of the sensitizer layer at the sensitizer layer triplet layer transfers energy to the molecules of the luminescent layer at the luminescent-layer triplet state and triggers triplet-triplet annihilation upconversion in the luminescent layer such that the luminescent layer emits light of a first color.

13 Claims, 9 Drawing Sheets

(56) References Cited

U.S. PATENT DOCUMENTS

| | | | |
|---|---|---|---|
| 10,033,019 B2* | 7/2018 | Jakobsson | C08G 61/02 |
| 2005/0158582 A1* | 7/2005 | Ise | C09K 11/06 |
| | | | 428/690 |
| 2011/0304263 A1* | 12/2011 | Xia | H01L 27/3211 |
| | | | 313/504 |
| 2016/0104847 A1* | 4/2016 | Xia | H01L 51/0052 |
| | | | 257/40 |
| 2017/0133603 A1* | 5/2017 | Joung | C09K 11/06 |
| 2019/0169495 A1* | 6/2019 | Vadrucci | C08K 5/053 |

* cited by examiner

ORGANIC LIGHT-EMITTING DIODE

FIELD OF THE INVENTION

The present invention relates to a light-emitting diode, and specifically to an organic light-emitting diode.

BACKGROUND OF THE INVENTION

A conventional organic light-emitting diode (OLED) is formed of several stacked nano-size layers including an anode, a hole transport layer (HTL), a luminescent layer, an electron transport layer (ETL) and a cathode in spatial order. When a voltage is applied to an OLED, a current of holes flows from the anode to the highest occupied molecular orbitals (HOMO) of the HTL, thus generating positive polarons, and at the same time a current of electrons flows from the cathode to the lowest unoccupied molecular orbitals (LUMO) of the ETL, thus generating negative polarons. The positive polarons and the negative polarons recombine in the luminescent layer, thereby generating singlet excitons and triplet excitons. Thereafter, the singlet excitons return to the ground state, upon which light is emitted.

In the evolution of OLEDs, extending the lifetime of blue OLEDs has been a key issue, the reason being that the energy of blue photons is relatively high, which results in the property of rapid degradation. To be specific, active exciton-polaron annihilation exists in blue OLEDs since excitons possess long lifespan and thus tend to react with excitons and form high energy polarons that break molecular bonds in the luminescent material and consequently reduce the lifetime of blue OLEDs.

In addition, light is emitted when singlet excitons return to the ground state, while triplet excitons in fluorescent materials cannot return to the ground state with photon emission. That is to say, a considerable amount of energy is wasted taking into consideration of the fact that triplet excitons account for 75 percent of excited excitons as a result of the recombination between the positive polarons and the negative polarons.

Therefore, in light of the above-mentioned drawbacks, OLEDs of the prior art still have room for improvement.

SUMMARY OF THE INVENTION

One of the objectives of the present invention is to provide an organic light-emitting diode which emits light utilizing the triplet energy thereof, thereby extending the lifetime of the organic light-emitting diode.

One embodiment of the present embodiment provides an organic light emitting diode including an anode, a cathode and a luminescent layered structure. The luminescent layered structure is disposed between the anode and the cathode. The luminescent layered structure has a luminescent layer and a sensitizer layer. The luminescent layer has a luminescent-layer ground state, a luminescent-layer singlet state and a luminescent-layer triplet state, in which two times of the luminescent-layer triplet state is higher than the luminescent-layer singlet state. The sensitizer layer has a sensitizer-layer triplet state, which is between the luminescent-layer singlet state and the luminescent-layer triplet state. The molecules of the sensitizer layer at the sensitizer layer triplet state transfer energy to the molecules of the luminescent layer at the luminescent-layer triplet state and triggers triplet-triplet annihilation upconversion in the luminescent layer such that the luminescent layer emits light of a first color.

To further understand the features and technical content of the present invention, please refer to the following detailed descriptions and drawings related to the present invention. However, the provided drawings are used only for providing reference and descriptions, and are not intended to limit the present invention.

DETAILED DESCRIPTION OF THE PREFERRED EMBODIMENTS

Embodiments of the present invention are described below with reference to FIG. 1 to FIG. 12. A person skilled in the art can understand the advantages and effects of the present invention from the description disclosed below. However, the content disclosed below is not intended to limit the protection scope of the present invention. The present invention can be implemented by a person skilled in the art based on different perspectives and applications without departing from the concept and spirit of the present invention. In addition, it should be stated in advance that the accompanying drawings of the present invention are merely used for illustration, and are not drawn according to actual dimensions for sake of clear illustration. Moreover, the same reference number corresponds to the same component. It should also be understood that expressions such as one component is "connected to" or "disposed on" another may mean that the former is either directly or indirectly connected to or disposed on the latter, wherein "connected" may refer to either physical or electrical connection.

First Embodiment

The organic light-emitting diode Z according to the first embodiment of the present invention is described between with reference to FIG. 1 to FIG. 7. First of all, referring to FIG. 1, the organic light-emitting diode Z provided by the first embodiment of the present invention includes an anode 1, a cathode 2, a luminescent layered structure 3, a hole transport layer 4 and an electron transport layer 5. The hole transport layer 4 is disposed between the anode 1 and the luminescent layered structure 3, and the electron transport layer 5 is disposed between the cathode 2 and the luminescent layered structure 3.

Figure 1:
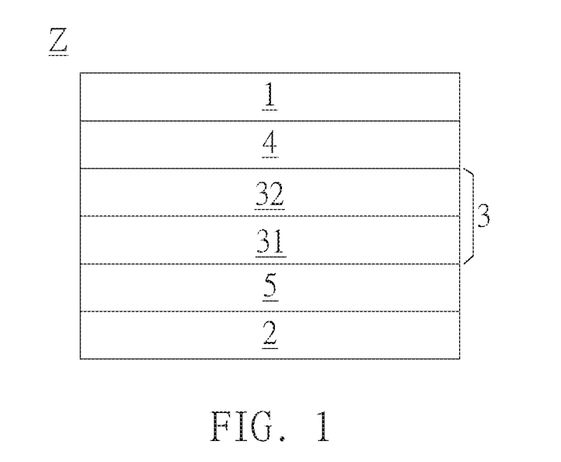
FIG. 1 is a schematic view illustrating an organic light-emitting diode according to a first embodiment of the present invention.

As shown in FIG. 1, the luminescent layered structure 3 has a luminescent layer 31 and a sensitizer layer 32. The luminescent layer 31 includes a luminescent-layer ground state, a luminescent-layer singlet state and a luminescent-layer triplet state. Specifically, in the present embodiment, the luminescent layer 31 is a TTA material layer, that is to say, two times of the luminescent-layer triplet state is higher than the luminescent-layer singlet state. More specifically, the luminescent layer 31 is preferably made of an anthracene derivative, a pyrene derivative or a perylene derivative; however, the present invention is not limited thereto. The anthracene derivative may be but not limited to 9,10-Di(2-naphthyl)anthracene (ADN), 2-methyl-9,1-D(2-naphthyl) anthracene, 2-tert-butyl-9,10-Di(2-naphthyl)anthracene, or 9,9'-dianthracene.

In the embodiment shown in FIG. 1, the sensitizer layer 32 is disposed between the luminescent layer 31 and the hole transport layer 4. However, the present invention is not limited thereto. In other embodiments, the position of the luminescent layer 31 and that of the sensitizer layer 32 are interchangeable. That is to say, in other embodiments, the sensitizer layer 32 can be disposed between the luminescent layer 31 and the electron transport layer 5. The sensitizer layer 32 has a sensitizer-layer triplet state, which is between the luminescent-layer singlet state and the luminescent-layer triplet state. In the present embodiment, the material of the sensitizer layer 32 is preferably a (8-hydroxyquinoline) metal complex or a 10-hydroxybenzo [h]quinoline-metal complex. More specifically, examples of the (8-hydroxyquinoline) metal complex may include but not limited to tris(8-hydroxyquinoline)-aluminium ($Alq_3$) and tris-(8-hydroxyquinoline)gallium ($Gaq_3$), and examples of 10-hydroxybenzo [h]quinoline-metal complex may include but not limited to bis(10-hydroxybenzo[h]quinolinato)beryllium.

Figure 2:
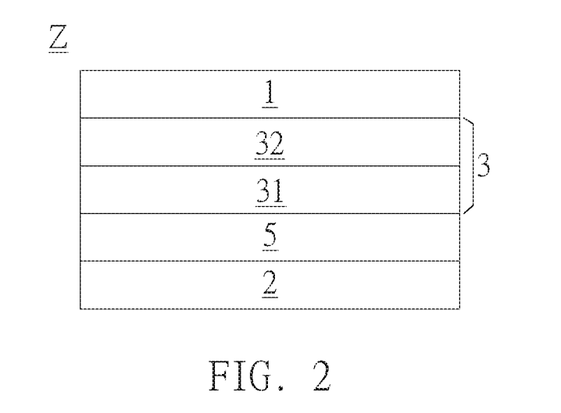
FIG. 2 illustrates a variant embodiment of the organic light-emitting diode according to the first embodiment of the present invention.
Figure 3:
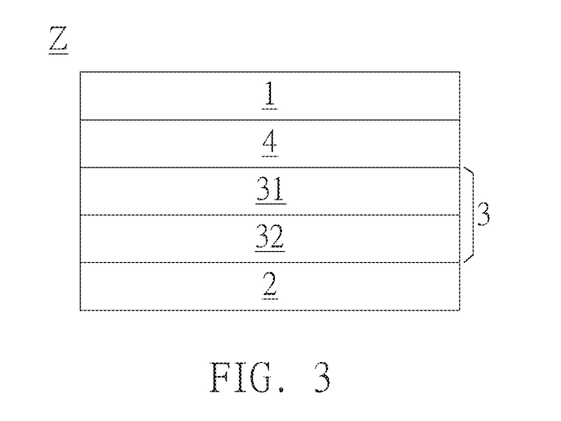
FIG. 3 illustrates another variant embodiment of the organic light-emitting diode according to the first embodiment of the present invention.

In a variant embodiment of the present embodiment, the sensitizer layer 32 can transport electron holes and acts as a hole transport layer disposed between the luminescent layer 31 and the anode 1, as shown in FIG. 2. In another variant embodiment, the sensitizer layer 32 can transport electrons and serve as an electron transport layer disposed between the luminescent layer 31 and the cathode 2, as shown in FIG. 3. Furthermore, in other embodiments, the sensitizer layer 32 can be added to the luminescent layer 31 as a dopant. It should be noted that the present invention is not limited to any of the above examples.

Figure 4:
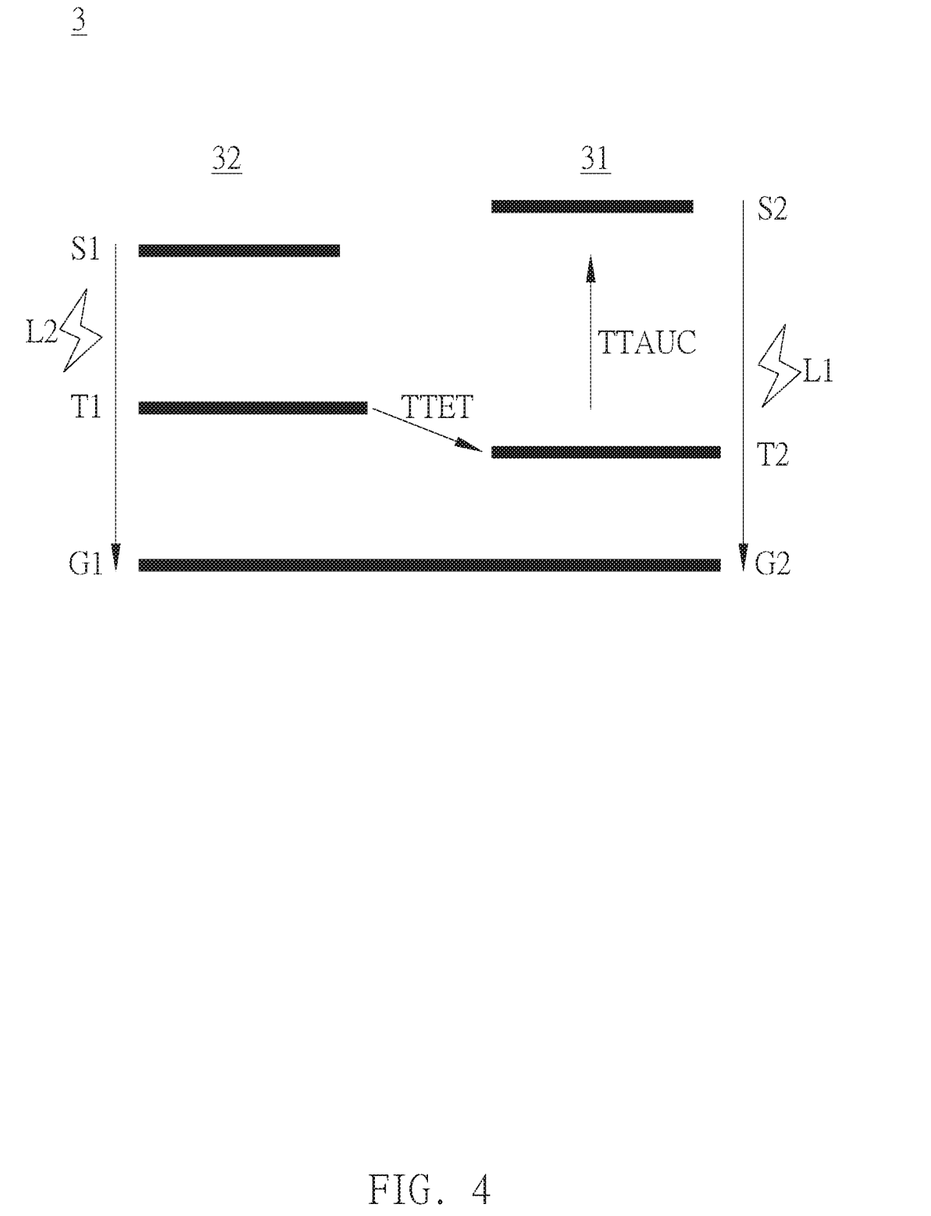
FIG. 4 is an energy level diagram of the luminescent layered structure of a first experimental example according to the first embodiment of the present invention.

The light emitting mechanism of the organic light-emitting diode of a first experimental example according to the present embodiment is described below with reference to FIG. 4, which shows an energy level diagram of the luminescent layered structure 3 of the first experimental example. In FIG. 4, the luminescent-layer singlet state S1, the sensitizer-layer triplet state T1 and the sensitizer-layer ground state G1 of sensitizer layer 32 and the luminescent-layer singlet state S2, the luminescent-layer triplet state T2, and the luminescent-layer ground state G2 of the luminescent layer 31 are shown. As shown in FIG. 4, the triplet state T1 of the sensitizer layer 32 is between the luminescent-layer singlet state S2 and the luminescent-layer triplet state T2. To be specific, the material of the luminescent layer 31 of the first experimental example is ADN, and that of the sensitizer layer 32 is $Alq_3$, in which the energy level of the luminescent layered structure 3 is shown in Table 1 below.

TABLE 1

|  | Sensitizer layer 32 | Luminescent layer 32 |
|---|---|---|
| Singlet state (eV) | 2.3 | 2.83 |
| Triplet state (eV) | 2.0 | 1.67 |

In the present embodiment, through the technical solution that the sensitizer layer 32 is disposed next to the luminescent layer 31 such that triplet-triplet energy transfer mechanism (TTET) between the sensitizer layer 32 and the luminescent layer 31 can occur, i.e. the molecules of the sensitizer layer 32 at the sensitizer-layer triplet state T1 transfer energy to the molecules of the luminescent layer 31 at the luminescent-layer triplet state T2 in a manner such that triplet-triplet annihilation upconversion mechanism (TTAUC) is triggered in the luminescent layer 31 thereafter.

Specifically, the aforementioned TTAUC mechanism occurs among excited triplet state molecules, wherein one excited triplet state molecule transfers energy to another excited triplet state molecule and returns to the ground state, and the excited triplet state molecule that receives the energy is raised to the singlet state. Next, molecules of the luminescent layer 31 that are raised to the singlet state return to the luminescent-layer ground state G2, thereby emitting light of a first color L1.

Referring to FIG. 4, in the present embodiment, molecules of the sensitizer layer 32 at the sensitizer-layer singlet state S1 emit light of a second color L2 when returning to the sensitizer-layer ground state G1. Furthermore, in the present embodiment, white light can be generated by mixing the first color light L1, the second color light L2, and light of a third color. For example, when using $Alq_3$ as the sensitizer layer 32 and ADN as the luminescent layer 31, then with an added light-emitting material that emits red light, a white light can be obtained by mixing the blue light emitted by ADN, the green light emitted by $Alq_3$ and the red light. However, the present invention is not limited thereto. For instance, in other embodiments, the material of the luminescent layer 31 and that of the sensitizer layer 32 are selected based on a predetermined color of light emitted by the organic light-emitting diode Z, thereby generating light of the predetermined color by mixing the first color light L1 and the second color light L2.

Figure 5:
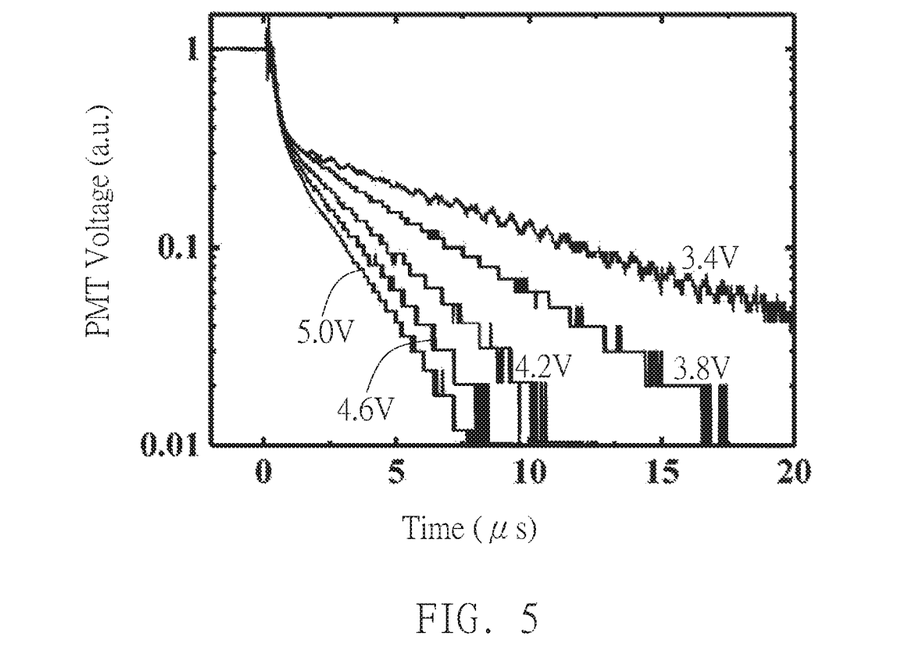
FIG. 5 is a diagram illustrating the transient electroluminescence of the first experimental example according to the first embodiment of the present invention.
Figure 6:
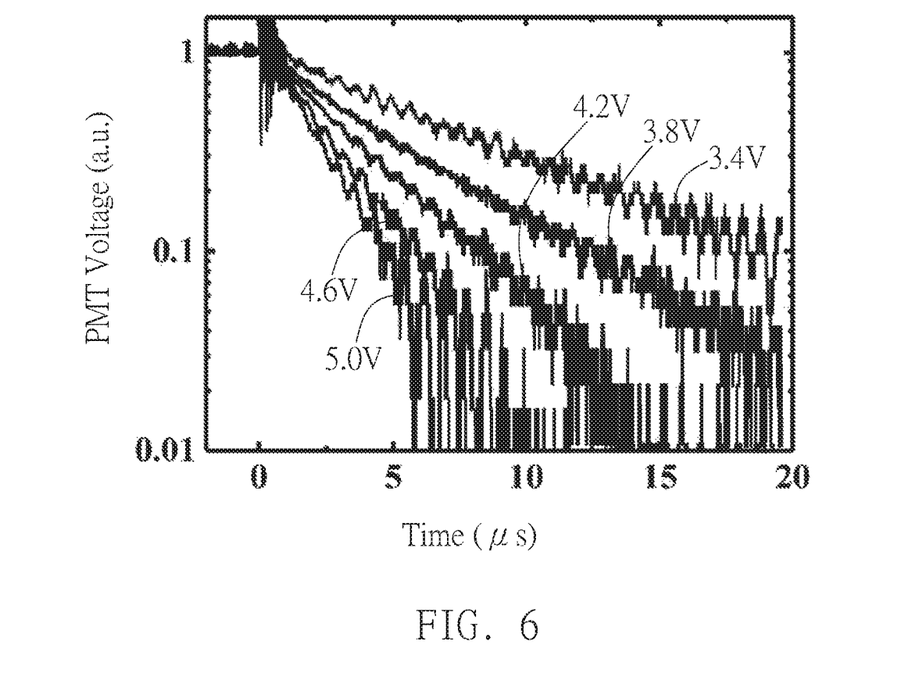
FIG. 6 illustrates the transient electroluminescence of the luminescent layer of the first experimental example according to the first embodiment of the present invention.

Please refer to FIG. 5 and FIG. 6, wherein FIG. 5 shows a diagram illustrating the electroluminescent property of the first experimental example according to the present embodiment, and FIG. 6 shows a diagram illustrating the transient electroluminescence of the luminescent layer of the first experimental example according to the present embodiment.

Specifically, in the first experimental example, indium tin oxide (ITO) is used as the anode 1, and LiF/Al is used as the cathode 2. The thickness of the hole transport layer 4 is 50 nm, and the material thereof is N,N'-di(1-naphthyl)-N,N'-diphenyl benzidine (NPB). The thickness of the electron transport layer 5 is 65 nm, and the material thereof is 4,7-diphenyl-1,10-phenanthroline (Bphen). The thickness of the sensitizer layer 32 is 5 nm, and the material thereof is $Alq_3$. The thickness of the luminescent layer 31 is 10 nm, and the material thereof is ADN. It should be noted that the above description regarding the materials used and the specifications thereof are the exemplary embodiment of the present invention; the present invention is not limited thereto.

In the experimental example shown in FIG. 5 and FIG. 6, the transient electroluminescence of the organic light-emitting diode Z is measured by first applying an electro-pulse to the organic light-emitting diode Z, and the light emitted by the organic light-emitting diode Z in response to the electro-pulse is gauged and converted into electric output with a photomultiplier. The curves shown in FIG. 5 respectively represent the electric signals outputted by the organic light-emitting diode Z in response to an input voltage of 5 V, 4.6 V, 4.2 V, 3.8 V and 3.4 V. As shown in FIG. 5, when each applied voltage is turned off at 0 second, the speed at which the organic light-emitting diode Z of the first experimental example emits light is of microsecond-scale. In general, the speed at which singlet excitons emit light is of nanosecond-scale, and that of triplet excitons is of microsecond-scale since triplet excitons decay slower owing to the spin conservation. That is to say, FIG. 5 shows that in the first experimental example the triplet excitons contribute to a larger percentage of total emission than organic light-emitting diodes in the prior art. The curves shown in FIG. 6 respectively represent the electric signals outputted by the luminescent layer 31 corresponding to an input electro-pulse of 5 V, 4.6 V, 4.2 V, 3.8 V and 3.4 V. It can be seen from FIG. 6 that in the first experimental example of the present embodiment, the first color light L1 emitted by the luminescent layer 31 (ADN) is mainly from the triplet excitons thereof.

Figure 7:
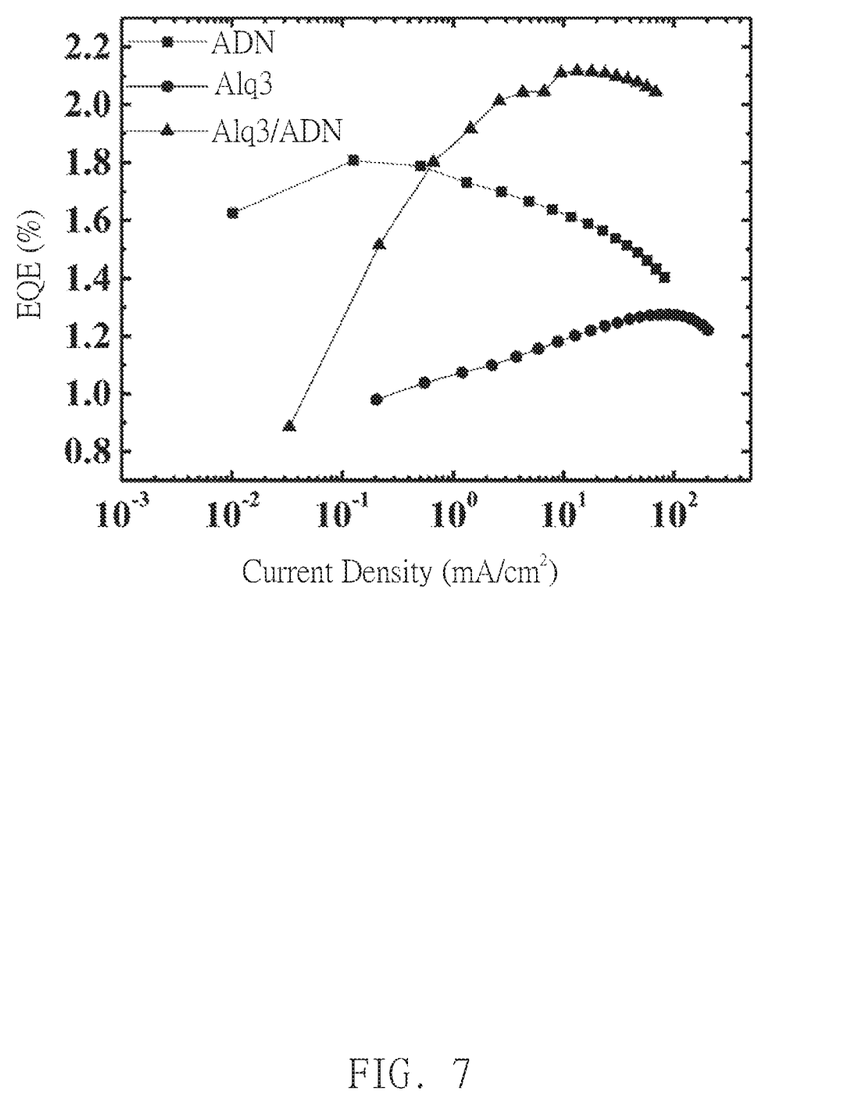
FIG. 7 is a diagram illustrating the external quantum efficiency of the first experimental example according to the first embodiment and those of comparative examples.

FIG. 7 illustrates the external quantum efficiency of the first experimental example (shown with the curve marked as $Alq_3$/ADN) according to the present embodiment and those of a first comparative example (shown with the curve marked as ADN) and a second comparative example (shown with the curve marked as $Alq_3$). The difference between the first experimental example and the first and second comparative examples lies in that the first experimental example has a sensitizer layer and a luminescent layer, whereas the first comparative example has only ADN as the luminescent layer and does not have a sensitizer layer; the second comparative example has only $Alq_3$ as the luminescent layer and does not have a sensitizer layer. As shown in FIG. 7, the first experimental example exhibits higher external quantum efficiency than the first comparative example and the second comparative example do within most part of the operational current density. As stated in the background of the invention, 75% of recombined positive polarons and negative polarons transform into triplet excitons, which means the waste in energy in the prior art. In the present embodiment, by adding the sensitizer layer 32 in the organic light-emitting diode Z and adjusting the thicknesses of the hole transport layer 4 and the electron transport layer 5, the negative polarons and the positive polarons recombine in the sensitizer layer 32 instead of the luminescent layer 31 so that singlet excitons and triplet excitons can be generated in the sensitizer layer 32, which triggers triplet-triplet energy transfer mechanism (TTET) between the luminescent layer 31 and the sensitizer layer 32 and then triplet-triplet annihilation upconversion mechanism (TTAUC) in the luminescent layer 31 thereafter. In this way, most of the triplet energy in the sensitizer layer 32 and the triplet energy in the luminescent layer 31 are converted to light emitted by the organic light-emitting diode Z, thereby increasing the external quantum efficiency of the organic light-emitting diode Z.

Figure 8:
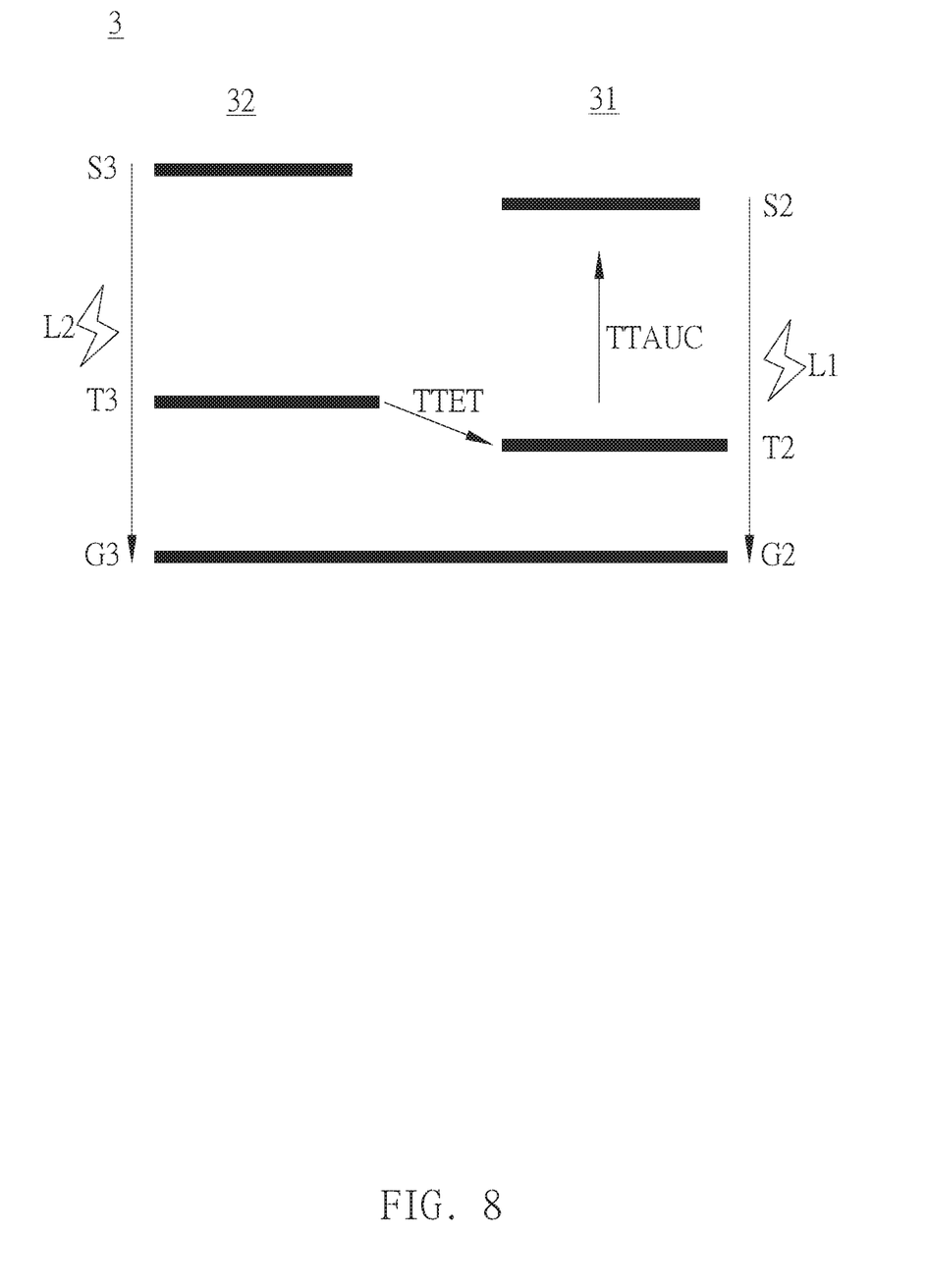
FIG. 8 illustrates an energy level diagram of the luminescent layered structure of a second experimental example according to the first embodiment of the present invention.

The second experimental example of the organic light-emitting diode Z of the present embodiment is described below with reference to FIG. 8 to FIG. 10. The second experimental example has a structure that is similar to that of the first experimental example with the main difference being that the material of the sensitizer layer 32 of the second experimental example is 1-(2, 5-dimethyl-4-(1-pyrenyl)phenyl)pyrene (DMPPP). FIG. 8 shows the energy level diagram of the luminescent layered structure 3 of the second experimental example. As shown in the figure, the sensitizer-layer triplet state T3 of the sensitizer layer 32 (DMPPP) is higher than the luminescent-layer triplet state T2 of the luminescent layer 31, and the sensitizer-layer singlet state S3 of the sensitizer layer 32 is higher than the luminescent-layer singlet state S2 of the luminescent layer 31. More specifically, the energy level of the luminescent layered structure 3 is shown in Table 2 below.

TABLE 2

|  | Sensitizer layer 32 | Luminescent layer 31 |
|---|---|---|
| Singlet state (eV) | 3.15 | 2.83 |
| Triplet state (eV) | 2.01 | 1.67 |

Figure 9:
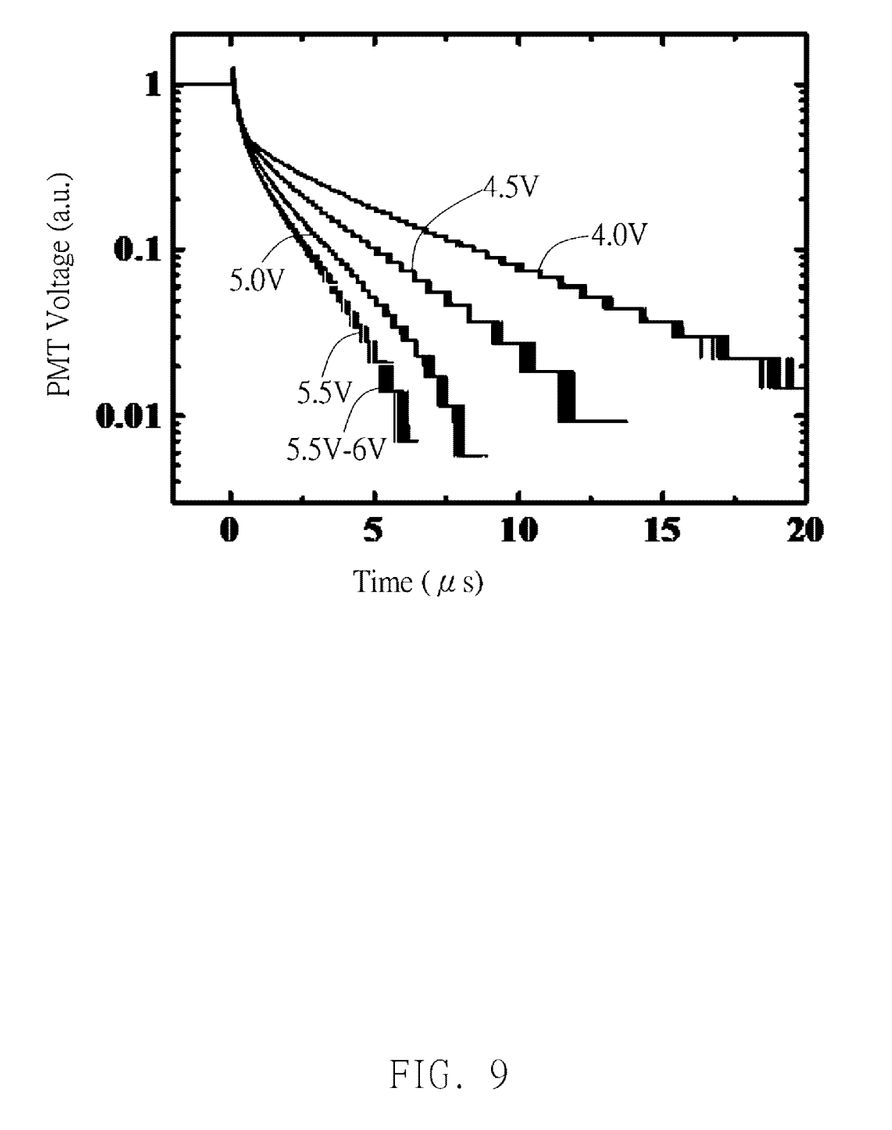
FIG. 9 illustrates the transient electroluminescence of the luminescent layer of the second experimental example according to the first embodiment of the present invention.

Please refer to FIG. 9. FIG. 9 illustrates the transient electroluminescence of the luminescent layer of the first experimental example according to the present embodiment. The curves shown in FIG. 9 respectively represent the electric signals outputted by the luminescent layer 31 (ADN) in response to an input voltage of 5.5 V-6 V, 5.5 V, 5.0 V, 4.5 V, and 4.0 V. As shown in FIG. 9, when each applied voltage is turned off at 0 second, the speed at which the organic light-emitting diode Z of the second experimental example emits light is of microsecond-scale, which indicates that a larger percentage of the total emission of the second experimental example is converted from the triplet energy as compared to a conventional organic light-emitting diode.

Figure 10:
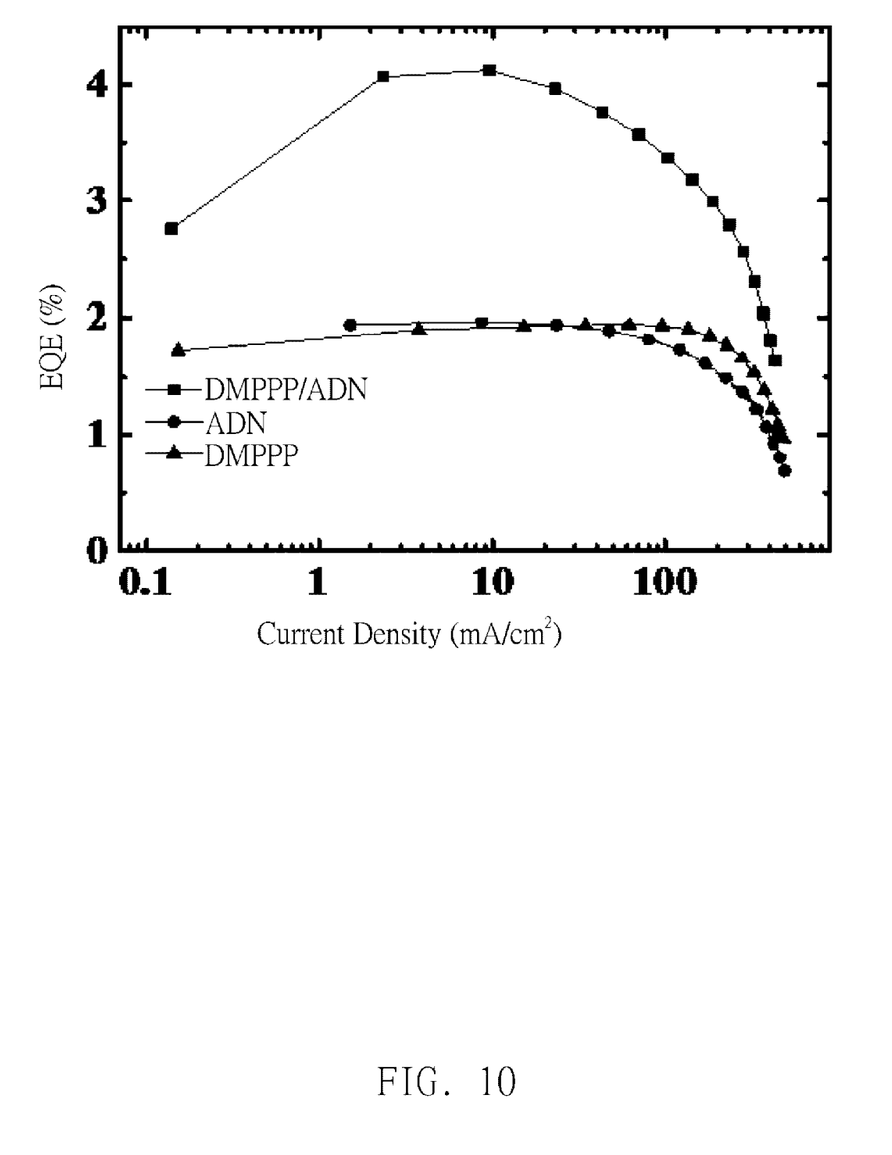
FIG. 10 is a diagram illustrating the external quantum efficiency of the second experimental example according to the first embodiment and those of the comparative examples.

FIG. 10 illustrates the external quantum efficiency of the second experimental example (shown with the curve marked as DMPPP/ADN) according to the present embodiment and those of a third comparative example (shown with the curve marked as ADN) and a fourth comparative example (shown with the curve marked as DMPPP). The difference between the second experimental example and the third and fourth comparative examples lies in that the second experimental example has a sensitizer layer 32 and a luminescent layer 31, whereas the third comparative example has only ADN has only the luminescent layer and does not have a sensitizer layer; the fourth comparative example has only DMPPP as the luminescent layer and does not have a sensitizer layer either. As shown in FIG. 10, the second experimental example, which includes DMPPP as the sensitizer layer 32 and ADN as the luminescent layer 31, exhibits higher external quantum efficiency than the third comparative example and the fourth comparative example.

It should be noted that the relative difference between the sensitizer-layer singlet state and the luminescent-layer singlet state is not limited in the present invention. A person skilled in the art can select the material of the sensitizer layer and that of the luminescent layer according to actual needs. For instance, when in a condition that ADN which emits blue light has been determined to be the material of the luminescent layer 31, the material of the sensitizer layer 32 can be decided based on the predetermined light color of the organic light-emitting diode Z. Specifically, when in one embodiment the predetermined light color is white, a material that has a singlet state lower than the luminescent-layer singlet state S2 can be selected as the material of the sensitizer layer 32, as in the case of the first experimental example, so that the second color light L2 is green. In this way, with a doped red light-emitting material the organic light-emitting diode Z can emit white light. When in another embodiment the predetermined light color of the organic light-emitting diode Z is blue, then a material that has a singlet state higher than the luminescent-layer singlet state S2 can be chosen to be the material of the sensitizer layer 32, as in the case of the second experimental example, so that the second color light L2 and the first light color L1 are both blue light.

In summary, the first embodiment of the present invention uses mainly the triplet energy thereof to emit light utilizing the technical solution of the sensitizer layer 32, which serves as the place the recombination between the positive polarons and the negative polarons takes place such that triplet-triplet annihilation upconversion mechanism can be triggered in the luminescent layer 31 by the triplet excitons in the sensitizer layer 32 generated from the recombination. Since the sensitizer layer 32 acts as the recombination zone in the present embodiment, high energy polarons are prevented from reacting with the excitons in the luminescent layer 31. Therefore, the triplet energy in the sensitizer layer 32 can be utilized to emit light by being transferred to the luminescent layer 31 and converted through TTAUC mechanism, thereby enhancing the illumination efficiency of the organic light-emitting diode Z and extending the lifetime thereof.

Second Embodiment

Figure 11A:
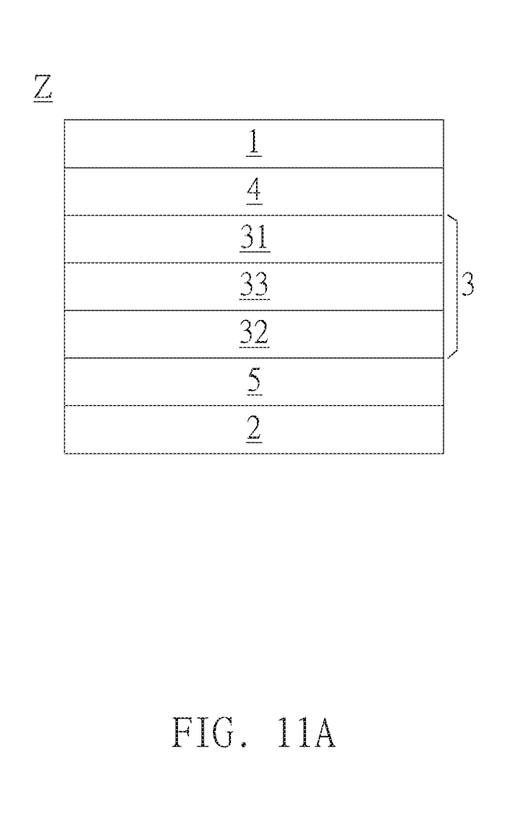
FIG. 11A is a schematic view of the organic light-emitting diode according to the second embodiment of the present invention.
Figure 11B:
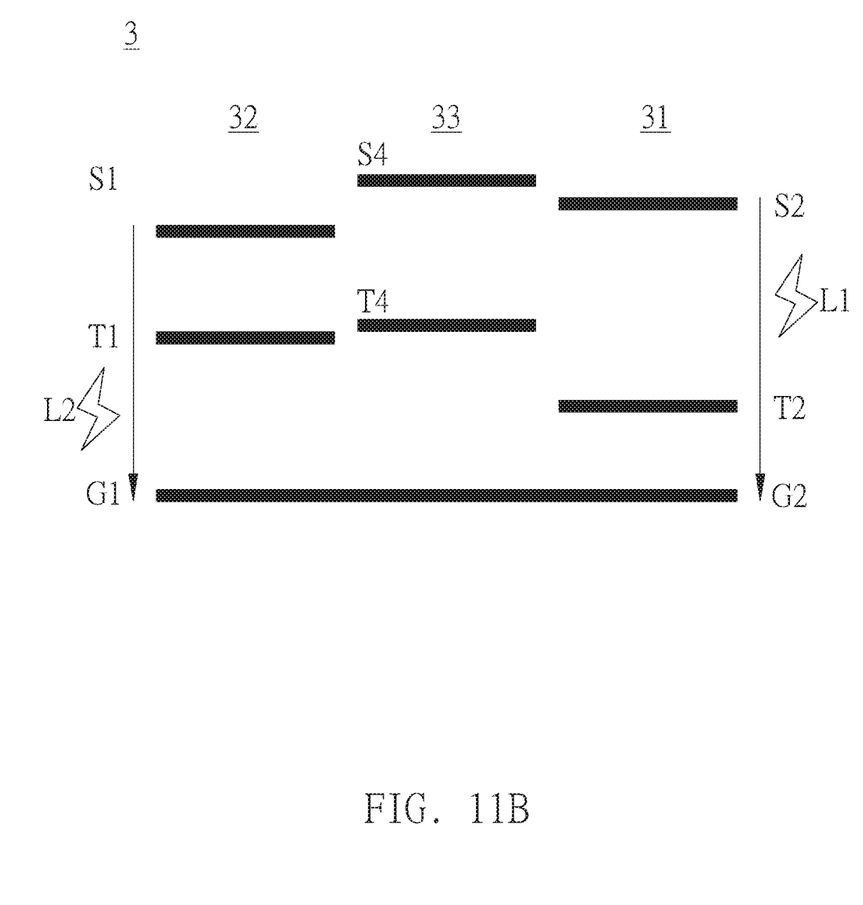
FIG. 11B illustrates an energy level diagram of the luminescent layered structure according to the second embodiment of the present invention.

Referring to FIG. 11A, the main difference between the present embodiment and the first embodiment lies in that the organic light-emitting diode Z of the second embodiment further includes a blocking layer 33 between the luminescent layer 31 and the sensitizer layer 32. With reference to FIG. 11B, the blocking layer 33 has a blocking-layer singlet state S4 and a blocking-layer triplet state T4, in which the blocking-layer singlet state S4 is higher than the luminescent-layer singlet state S2, and the blocking-layer triplet state T4 is higher than the luminescent-layer triplet state T2.

With the blocking layer 33, the triplet energy of the sensitizer layer 32 can be transferred to the triplet state of the luminescent layer 31. At the same time, the quenching effects between the sensitizer layer 32 and the luminescent layer 31 can be reduced. In this way, the illumination efficiency of the organic light-emitting diode Z can be further improved.

Furthermore, the material of the blocking layer 33 can be 1-(2, 5-dimethyl-4-(1-pyrenyl)phenyl)pyrene (DMPPP) or 1,3,5-Tri(1-pyrenyl)benzene (TPB3). However, the present invention is not limited thereto. Specifically, the blocking layer 33 of the present embodiment is DMPPP, whose energy level is shown in Table 3 below.

TABLE 3

|  | Sensitizer layer 32 | Blocking layer 33 | Luminescent layer 31 |
| --- | --- | --- | --- |
| Singlet state (eV) | 2.8 | 3.15 | 2.83 |
| Triplet state (eV) | 2.0 | 2.05 | 1.67 |

Figure 12:
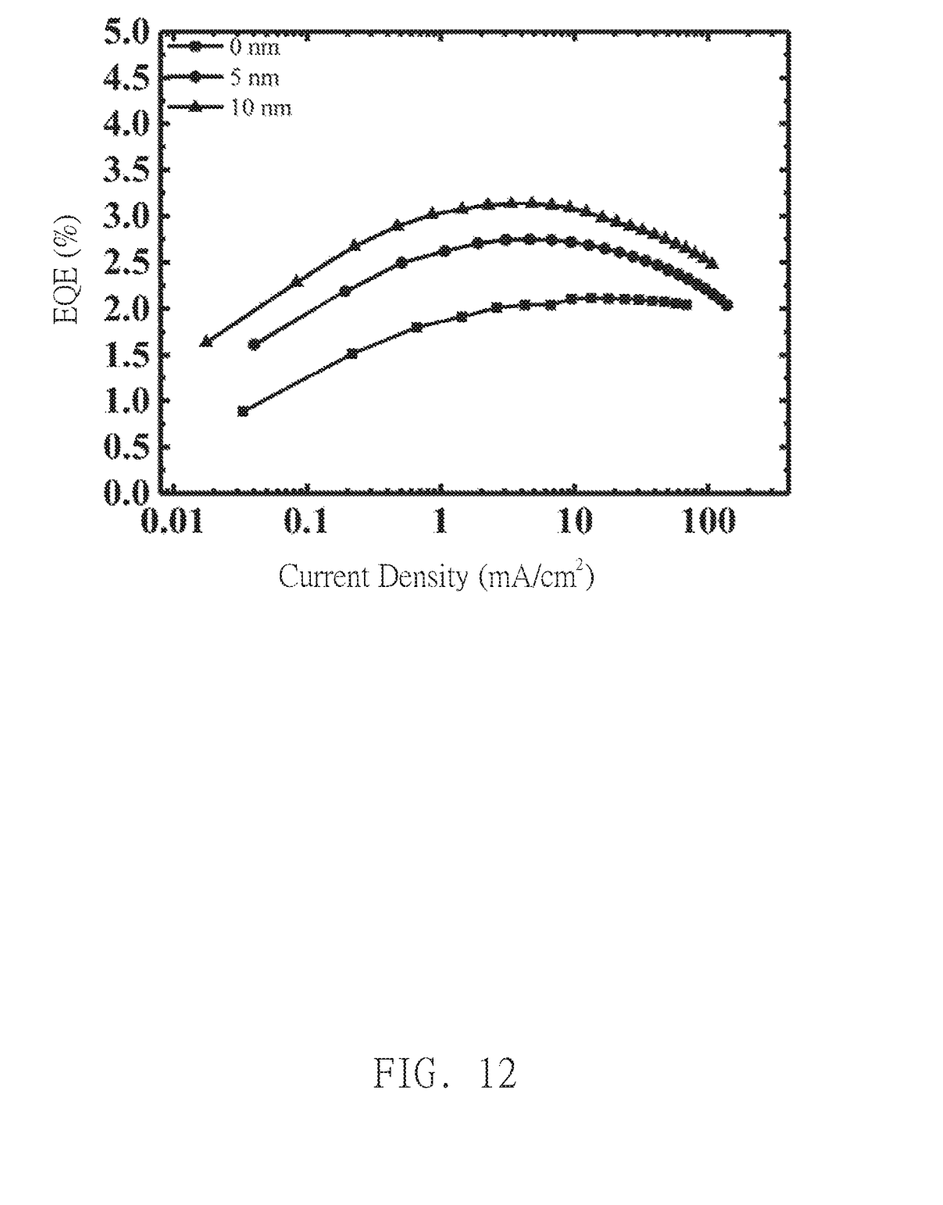
FIG. 12 is a diagram illustrating the external quantum efficiency of a first experimental example, a second experimental example and a third experimental example according to the second embodiment of the present invention.

Please refer to FIG. 12, which shows a diagram illustrating the external quantum efficiency of a first experimental example, a second experimental example and a third experimental example according to the second embodiment of the present invention. The first experimental example of the present embodiment uses ADN as the luminescent layer, Alq$_3$ as the sensitizer layer, and the first experimental example has no blocking layer. The second experimental example is shown with a curve marked as 5 nm in FIG. 12. The difference between the first experimental example and the second experimental example is that the second experimental example has a blocking layer 33 with a thickness of 5 nm between the luminescent layer 31 and the sensitizer layer 32. The material of the blocking layer 33 is DMPPP. The third experimental example is shown with a curve marked as 10 nm in FIG. 12. The difference between the first experimental example and the third experimental example is that the third experimental example has a blocking layer 33 with a thickness of 10 nm between the luminescent layer 31 and the sensitizer layer 32. The material of the blocking layer 33 of the third experimental example is DMPPP. As shown in FIG. 12, the third experimental example exhibits higher external quantum efficiency than the second experimental example, which in turn offers higher external quantum efficiency than the first experimental example. Therefore, the present embodiment shows that adding a blocking layer 33 to the organic light-emitting diode Z (as in the second experimental example and third experimental example of the present embodiment compared to the first experimental example) can effectively enhance the efficiency of the organic light-emitting diode Z.

In summary, the embodiments of the present invention achieves "the molecules of the sensitizer layer at the sensitizer-layer triplet state transfer energy to the molecules of the luminescent layer at the luminescent-layer triplet state and triggers triplet-triplet annihilation upconversion in the luminescent layer such that the luminescent layer emits light of a first color" through the technical solutions that "two times of the luminescent-layer triplet state is higher than the luminescent-layer singlet state" and "the sensitizer-layer triplet state is between the luminescent-layer singlet state and the luminescent-layer triplet state".

Through the aforementioned technical solutions, the organic light-emitting diode Z of the present embodiments utilizes the sensitizer layer 32 to perform triplet-triplet energy transfer between the sensitizer layer 32 and the luminescent layer 31, thereby triggering triplet-triplet annihilation upconversion mechanism in the luminescent layer 31. In this way, triplet energy of the luminescent layer 31 and that of the sensitizer layer 32 can be converted into light emitted by the organic light-emitting diode Z, thereby effectively enhancing the illumination efficiency and the lifespan of the organic light-emitting diode Z.

In addition, in some embodiments, a blocking layer can be added to the organic light-emitting diode Z, in which the singlet state of the blocking layer is higher than the singlet state of the luminescent layer, and the triplet state of the blocking layer is higher than the triplet state of the luminescent layer. In this way, the illumination efficiency of the organic light-emitting diode can be further increased.

The present invention has been described with reference to the above embodiments, but the above embodiments are merely examples for implementing the present invention. It should be noted that the disclosed embodiments are not intended to limit the scope of the present invention. On the contrary, any modification and equivalent configuration within the spirit and scope of the appended claims shall fall within the scope of the present invention.

What is claimed is:

1. An organic light-emitting diode, comprising:
an anode;
a cathode; and
a luminescent layered structure disposed between the anode and the cathode, including a luminescent layer having a luminescent-layer ground state, a luminescent-layer singlet state and a luminescent-layer triplet state, in which two times of the luminescent-layer triplet state is higher than the luminescent-layer singlet state; and
a sensitizer layer having a sensitizer-layer triplet state, which is between the luminescent-layer singlet state and the luminescent-layer triplet state,
wherein molecules of the sensitizer layer at the sensitizer-layer triplet state transfer energy to molecules of the luminescent layer at the luminescent-layer triplet state and triggers triplet-triplet annihilation upconversion in the luminescent layer such that the luminescent layer emits light of a first color.

2. The organic light-emitting diode according to claim 1, further comprising:
a hole transport layer disposed between the anode and the luminescent layered structure; and
an electron transport layer disposed between the cathode and the luminescent layered structure.

3. The organic light-emitting diode according to claim 1, wherein the sensitizer layer is an electron transport layer, and the organic light-emitting diode further comprises a hole transport layer disposed between the anode and the luminescent layered structure.

4. The organic light-emitting diode according to claim 1, wherein the sensitizer layer is a hole transport layer, and the organic light-emitting diode further comprises an electron transport layer disposed between the cathode and the luminescent layered structure.

5. The organic light-emitting diode according to claim 1, wherein the sensitizer layer includes one of a (8-hydroxyquinoline) metal complex and a 10-hydroxybenzo [h]quinoline-metal complex.

6. The organic light-emitting diode according to claim 5, wherein the sensitizer layer includes one of tris(8-hydroxyquinoline)aluminum and bis(10-hydroxybenzo[h]quinolinato)beryllium.

7. The organic light-emitting diode according to claim 1, wherein the sensitizer layer includes 1-(2, 5-dimethyl-4-(1-pyrenyl)phenyl)pyrene.

8. The organic light-emitting diode according to claim 1, wherein the emissive layer is selected from the group consisting of an anthracene derivative, a pyrene derivative and a perylene derivative.

9. The organic light-emitting diode according to claim 8, wherein the anthracene derivative is selected from the group consisting of 9,10-Di(2-naphthyl)anthracene, 2-methyl-9,10-D(2-naphthyl)anthracene, 2-tert-butyl-9,10-Di(2-naphthyl)anthracene, and 9,9'-dianthracene.

10. The organic light-emitting diode according to claim 1, wherein the sensitizer layer further includes a sensitizer-layer singlet state and a sensitizer-layer ground state, in which the molecules of the sensitizer layer at the sensitizer-layer singlet state returns to the sensitizer-layer ground state and emits light of a second color.

11. The organic light-emitting diode according to claim 10, wherein white light can be generated by mixing light of the first color and light of the second color.

12. The organic light-emitting diode according to claim 1, wherein the luminescent layered structure further includes a blocking layer disposed between the sensitizer layer and the luminescent layer, in which the blocking layer has a blocking-layer ground state and a blocking-layer triplet state, the blocking-layer singlet state being higher than the luminescent-layer singlet state, and the blocking-layer triplet state being higher than the luminescent-layer triplet state.

13. The organic light-emitting diode according to claim 12, wherein the blocking layer is selected from the group consisting of 1-(2,5-dimethyl-4-(1-pyrenyl)phenyl)pyrene and 1,3,5-Tri(1-pyrenyl)benzene.

* * * * *